(12) United States Patent
Roberts, Jr. et al.

(10) Patent No.: US 12,360,162 B2
(45) Date of Patent: Jul. 15, 2025

(54) METHOD FOR SEMICONDUCTOR DEVICE INTERFACE CIRCUITRY FUNCTIONALITY AND COMPLIANCE TESTING

(71) Applicant: CELERINT, LLC, New York, NY (US)

(72) Inventors: Howard H. Roberts, Jr., Austin, TX (US); LeRoy Growt, Kyle, TX (US); Thomas Schoen, Austin, TX (US)

(73) Assignee: CELERINT, LLC, New York, NY (US)

( * ) Notice: Subject to any disclaimer, the term of this patent is extended or adjusted under 35 U.S.C. 154(b) by 0 days.

(21) Appl. No.: 18/734,706

(22) Filed: Jun. 5, 2024

(65) Prior Publication Data
US 2024/0361386 A1 Oct. 31, 2024

Related U.S. Application Data

(62) Division of application No. 17/122,202, filed on Dec. 15, 2020, now Pat. No. 12,025,663.

(60) Provisional application No. 62/948,466, filed on Dec. 16, 2019.

(51) Int. Cl.
G01R 31/319 (2006.01)
G01R 31/3183 (2006.01)

(52) U.S. Cl.
CPC ......... G01R 31/31924 (2013.01); G01R 31/31835 (2013.01); G01R 31/31905 (2013.01); G01R 31/31926 (2013.01)

(58) Field of Classification Search
None
See application file for complete search history.

(56) References Cited

U.S. PATENT DOCUMENTS

| | | | |
|---|---|---|---|
| 4,646,299 A | 2/1987 | Schinabeck et al. | |
| 6,324,485 B1 | 11/2001 | Ellis | |
| 6,904,375 B1 * | 6/2005 | Sabih | G01R 31/31926 324/537 |
| 9,207,282 B2 | 12/2015 | Faehnrich | |
| 10,690,715 B2 | 6/2020 | Borthwick | |
| 11,486,955 B2 * | 11/2022 | Tong | G01R 31/2889 |
| 11,555,856 B2 | 1/2023 | Roberts, Jr. et al. | |
| 12,025,663 B2 * | 7/2024 | Roberts, Jr. | G01R 31/31905 |
| 2007/0168817 A1 | 7/2007 | Viens | |
| 2008/0315862 A1 | 12/2008 | Daniel | |
| 2010/0164519 A1 | 7/2010 | Sellathanby et al. | |

(Continued)

Primary Examiner — Jermele M Hollington
(74) Attorney, Agent, or Firm — Greenblum and Bernstein, P.L.C.

(57) ABSTRACT

A method is provided for determining a decoupling capacitance of a device under test (DUT) interface circuitry, which is between automated testing equipment (ATE) and a DUT. The method: disconnects the DUT from the DUT interface circuitry; connects a Device Under Testing Power Supply (DPS) resource as a DUT Power Supply to the DUT interface circuitry; sets a current clamp of the DPS resource to a test application level; turns off the DPS resource voltage; sets the DPS resource to a force voltage mode; sets the current clamp to a minimum current level; turns on the output; waits a period of time to allow the decoupling capacitance to charge; places the DPS resource into a voltage measurement mode; adds any delay time to the period of time; measures the voltage before the capacitance is fully charged; and determines the decoupling capacitance.

9 Claims, 12 Drawing Sheets

Tester Resources for Performing DIH Testing

| Resource | System Count | Cost (per channel) | Test Function | Example |
|---|---|---|---|---|
| DPE | 512-2048 | lowest | FRT, IRP (FFT), Leakage | UP1600 |
| PPMU | 512-2048 | lowest | leakage, FVMI | UP1600 |
| SMU | 16-128 | medium | leakage, precision FVMI, FIMV | VI80 |
| AWG | 1-4 | highest | source arbitrary signal | UltraPAC80 |
| DIG | 1-4 | highest | measure arbitrary signal, FFT | UltraPAC80 |
| DPS | 32-256 | medium | FVMI, source I – measure V | UVS256 |

DPE – digital pin electronics
PPMU – per pin parametric measuring unit
SMU – source measurement unit
AWG – arbitrary waveform generator
DIG – digitizer
DPS – DUT power supply FRT – functional reflectometry test
IRP – impedance response profile
FFT – fast Fourier transform
FVMI – force voltage, measure current
FIMV – force current, measure voltage
DPS – DUT power supply

(56) References Cited

U.S. PATENT DOCUMENTS

| | | | |
|---|---|---|---|
| 2014/0070831 A1* | 3/2014 | Kushnick | G01R 1/36 |
| | | | 324/754.07 |
| 2015/0054532 A1 | 2/2015 | Yoo et al. | |
| 2019/0164851 A1* | 5/2019 | Yoo | G01R 31/2879 |
| 2021/0181252 A1* | 6/2021 | Roberts, Jr. | G01R 31/31924 |

* cited by examiner

FIG. 1
Tester Resources for Performing DIH Testing

| Resource | System Count | Cost (per channel) | Test Function | Example |
|---|---|---|---|---|
| DPE | 512-2048 | lowest | FRT, IRP (FFT), Leakage | UP1600 |
| PPMU | 512-2048 | lowest | leakage, FVMI | UP1600 |
| SMU | 16-128 | medium | leakage, precision FVMI, FIMV | VI80 |
| AWG | 1-4 | highest | source arbitrary signal | UltraPAC80 |
| DIG | 1-4 | highest | measure arbitrary signal, FFT | UltraPAC80 |
| DPS | 32-256 | medium | FVMI, source I – measure V | UVS256 |

DPE – digital pin electronics
PPMU – per pin parametric measuring unit
SMU – source measurement unit
AWG – arbitrary waveform generator
DIG – digitizer
DPS – DUT power supply FRT – functional reflectometry test
IRP – impedance response profile
FFT – fast Fourier transform
FVMI – force voltage, measure current
FIMV – force current, measure voltage
DPS – DUT power supply Digital Pin Electronics Resource in a Semiconductor Tester Source-Measurement Unit (SMU)

Device Under Test (DUT) Power Supply (DPS)

Device Under Test (DUT) Interface Hardware (DIH)

Double-Pole Double-Throw Switch in DIH

Using "Chattering" in Solid State Switches

Measuring Coupling Capacitance With A Source Measurement Unit (SMU)

Measuring Decoupling Capacitance With A Device Under Test (DUT) Power Supply (DPS) Having Dual DPS Power Supplies Digital Test Bus for Analog Circuits

METHOD FOR SEMICONDUCTOR DEVICE INTERFACE CIRCUITRY FUNCTIONALITY AND COMPLIANCE TESTING

CROSS-REFERENCE TO RELATED APPLICATION

This is a divisional application of U.S. patent application Ser. No. 17/122,202, filed Dec. 15, 2020, which claims the benefit of U.S. Provisional Patent Application No. 62/948,466, entitled "Methods for DIH Functionality and Compliance Testing," filed on Dec. 16, 2019. The entire disclosure of each of the above-mentioned documents is incorporated by reference herein in its entirety.

TECHNICAL FIELD

The present disclosure is related to automated manufacturer systems and methods, particularly automated semiconductor interface testing methods. In particular, the present disclosure is related to optimizing the methodology of testing the functionality and compliance of semiconductor device test interface circuitry, located between the Automated Test Equipment (ATE) and the semiconductor device under test (DUT). This hardware is generally referred to as the Device Interface Hardware (DIH) or the "Device Under Test Interface Hardware" (DUT Interface Hardware".

BACKGROUND

Manufacturing and production industries use automated test equipment (ATE) to analyze and assess integrity and operability of manufactured products at various stages of production. Robotic manipulator machines are often employed during testing by ATE to manipulate work pieces and products into and out of connection with the ATE. The semiconductor devices under test (DUTs) are presented to a test site of the ATE by the robotic machine, tested by the ATE, and then sorted and dispensed by the robotic machine into groups or bins (or otherwise according to an applicable scheme) according to test results. Because many diverse types of DUTs are tested by ATEs, and DUTs may be tested at various stages of production (e.g., final test, work piece probe, etc.), ATEs are varied in design according to the particular purpose, device, and/or product for testing. Similarly, robotic manipulator machines vary according to application and compatibility with the ATE.

Although varied, ATEs and robotic manipulators each usually include several typical operational units. ATEs and robotic manipulators are widely used, for example, in the production of electronic products, such as analog and digital components, circuits and devices (including semiconductors, integrated circuits, microprocessors, and the like).

The ATE includes a system controller, which controls the system and movement of data into and out of the system. The ATE also includes test data and test program storage, pattern memory, system power supplies, direct current reference supply unit, analog current reference supply unit, system clocks and calibration circuits, timing and time set memory, and precision measurement units (which may include digital, analog or mixed signal test resource circuitry). In addition, a test head of the ATE includes pin electronics driver cards providing pin circuitry (such as for comparators, current loads and other test resources) for pin electronics testing of DUTs. A device interface board (DIB) (also referred to as "load board) connects to the test head and provides connection socket(s) for the DUT or DUTs, as applicable. The ATE also includes external interfaces for connection to robotic manipulators for test devices (referred to as "handlers" or "device handlers"), as well as interfaces to computers, networks, and/or other instruments, devices or components.

Robotic manipulators, i.e., handlers, include mechanical systems and controllers. The mechanical systems physically deliver DUTs for presentation to the socket(s) of the DIB connected to the test head of the ATE, deposit the DUTs in the socket(s) during testing, remove the DUTs from the socket(s) post testing, and sort the DUTs according to respective test result after testing. The controller directs operations of the mechanical systems of the handler and communicates with the ATE. As required, handlers can include additional features of memory and specific units according to application and testing environment.

In conventional testing of devices by an ATE and mechanical manipulation of devices by a handler, the ATE commences testing each device when deposited by the handler in a socket of the DIB connected to the test head. When testing is completed, the handler must remove the tested device from the socket and transport a next device to the socket for testing. The present invention, however, is not directed to the ATE conducting tests of the DUTs.

SUMMARY

The present invention is directed to optimizing the methodology of testing the functionality and compliance of semiconductor device test interface circuitry, located between the Automated Test Equipment (ATE) and the semiconductor device under test (DUT). This circuitry is generally referred to as the Device Interface Hardware (DIH) or the "Device Under Test Interface Hardware" (DUT Interface Hardware). This DIH may include electrical components, including one or more printed circuit boards, electrical connectors, electrical cables, and pogo pin interfaces. The printed circuit boards may include an array of active and passive components, such as resistors, capacitors, inductors, filters, operational amplifiers, switches (relays), and other integrated circuits.

In an embodiment, a method is provided method for testing the functionality of a device under test interface circuitry located between the automated testing equipment (ATE) and a device under test (DUT). The method includes disconnecting the device under test from the device under test interface circuitry, utilizing a Source Measurement Unit (SMU) that generates and measures voltage and current, and testing a switch located in the device under test interface circuitry using a two-state alarm methodology. The method also includes applying a voltage using the a voltage source measurement device in a first state in which force and sense lines of the voltage source measurement device are connected in the device under test interface circuitry. The method further includes detecting whether an alarm signal due to an open circuit has been activated, and determining that the switch being tested in the device under test interface circuitry is operating properly by the absence of the alarm signal being activated.

In another embodiment, the method also includes determining that the switch being tested in the device under test interface circuitry is not operating properly by the presence of the alarm signal being activated.

In a further embodiment, the method further includes applying a voltage using the a voltage source measurement device in a second state in which force and sense lines of the voltage source measurement device are not connected in the device under test interface circuitry.

In an embodiment, the method includes determining that the switch being tested in the device under test interface circuitry is not operating properly by the absence of the alarm signal being activated.

In another embodiment, the switch being tested in the device under test interface circuitry is a double pole, double throw electromechanical switch.

In a further embodiment, the sampling rate of the applied voltage on the sense line is be set to be substantially faster than the disconnect time of the double pole, double throw electromechanical switch.

In an embodiment, the switch being tested in the device under test interface circuitry is a solid state switch.

In another embodiment, the solid state switch uses chattering to suspend the solid state in the disconnected state in order to give the SMU a sufficient number of samples to detect the force and sense lines not being connected.

In a further embodiment, the chattering suspends the switch between the first state and a second state at approximately a 25% and a 75% position.

In an embodiment, the duration of both the first state and the second state is approximately 50% of a disconnect time.

In another embodiment, a method is provided for determining the decoupling capacitance of a device under test interface circuitry located between automated testing equipment (ATE) and a device under test (DUT). The method includes disconnecting the device under test from the device under test interface circuitry, connecting a DPS resource as a DUT Power Supply to the device under test interface circuitry, and setting a current clamp of the DPS resource to a test application level. The method also includes turning off the DPS resource voltage and confirming a discharged state of zero volts, setting the DPS resource to a force voltage mode; and setting the current clamp to a minimum current level and programming the DPS resource to output a predetermined low voltage level. Additionally, the method includes turning on the output at time zero, waiting a period of time dt to allow the decoupling capacitance to charge up from a fixed amount of current based on the current clamp level I, and placing the DPS resource into a voltage measurement mode having high impedance. The method further includes adding any delay time to waiting period of time dt, measuring the voltage dv before the capacitance is fully charged, and determining the decoupling capacitance C.

In a further embodiment, the determining the decoupling capacitance C is determined by the equation $C = I\, dv/dt$.

In an embodiment, the setting the current clamp to a minimum current level corresponds to a minimum current level of 1 to 3 volts.

In another embodiment, the setting the current clamp to a minimum current level corresponds to a minimum current level determined by a circuit simulation.

In a further embodiment, the waiting a period of time dt is determined by a circuit simulation.

In an embodiment, the connecting a DPS resource as a DUT Power Supply to the device under test interface circuitry includes connecting two DPS resources as a merged DUT Power Supply.

In another embodiment, the two DPS resources include a first DPS resource that supplies fixed current in the clamped mode, and a second DPS resource that makes voltage measurements in a voltmeter mode.

In a further embodiment, the first DPS resource and the second DPS resource are controlled independently from one another.

In an embodiment, the multiple measurements are conducted using the merged DUT Power Supply, and the decoupling capacitance is determined using linear regression.

In another embodiment, a non-transitory, computer-readable storage medium having one or more computer programs stored therein for testing the functionality of a device under test interface circuitry located between automated testing equipment (ATE) and a device under test (DUT) is provided, which when executed by a computer, causes operations to be performed. The operations include disconnecting the device under test from the device under test interface circuitry, and testing a switch located in the device under test interface circuitry using a two-state alarm process. The operations also include applying a voltage using the a voltage source measurement device in a first state in which force and sense lines of the voltage source measurement device are connected in the device under test interface circuitry. The operations further include detecting whether an alarm signal due to an open circuit has been activated, and determining that the switch being tested in the device under test interface circuitry is operating properly by the absence of the alarm signal being activated.

BRIEF DESCRIPTION OF THE DRAWINGS

FIG. 1 provides a Table listing Tester Resources for Performing DIH Testing;

DETAILED DESCRIPTION

Figure 2:
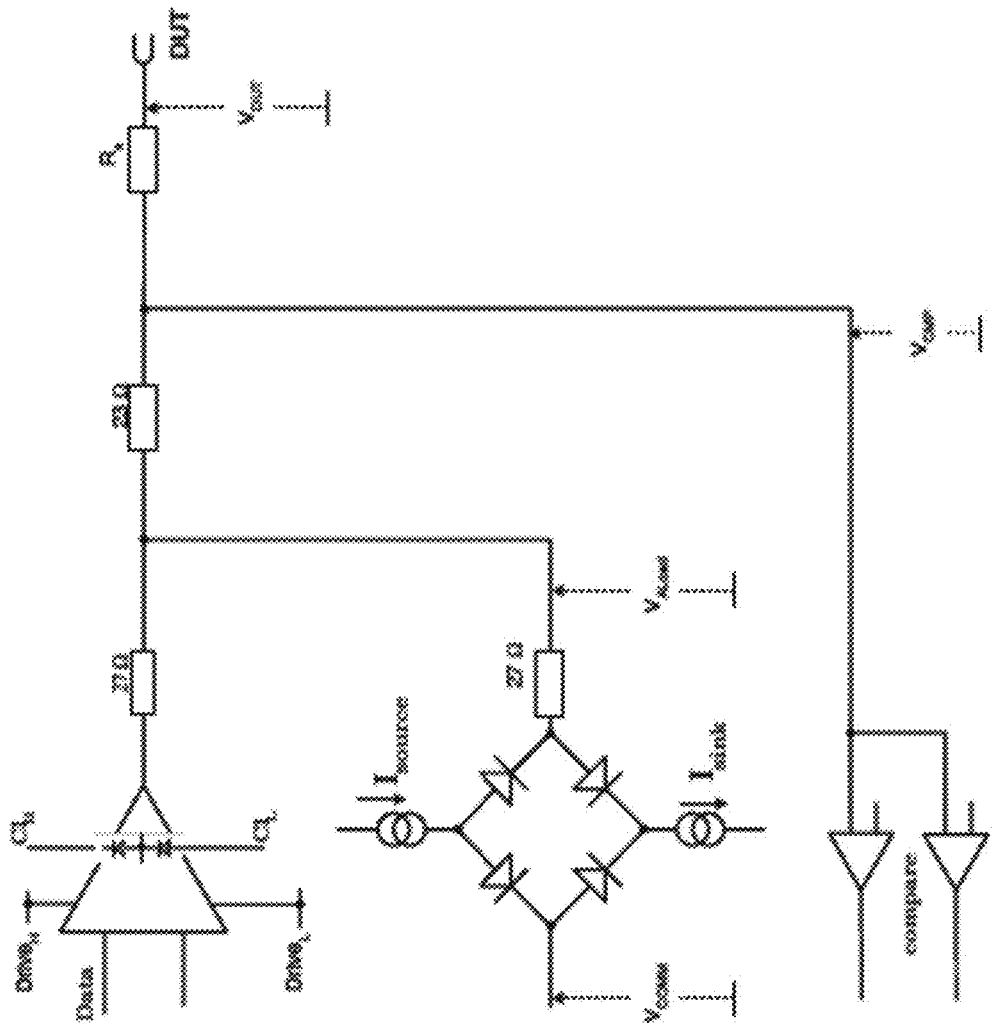
FIG. 2 illustrates an embodiment of a Digital Pin Electronics Resource in Semiconductor a Semiconductor Tester.
Figure 3:
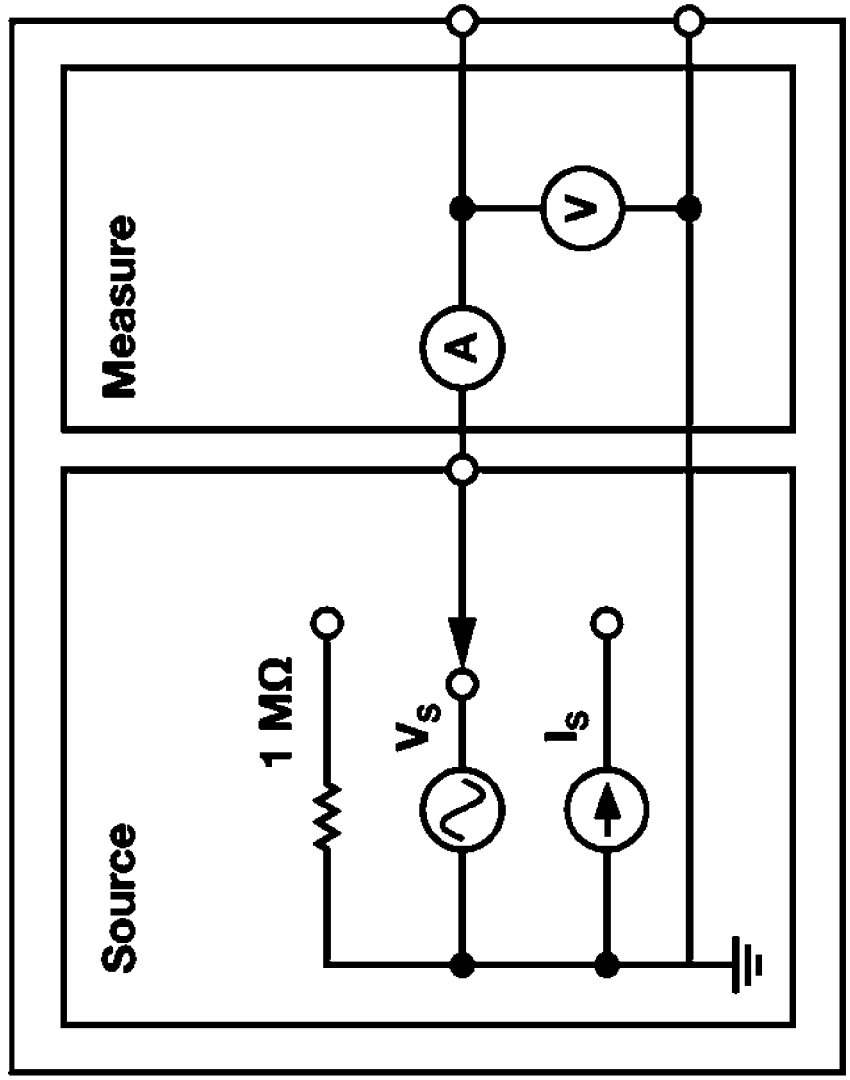
FIG. 3 illustrates a Source-Measurement Unit (SMU)

In view of the foregoing, the present disclosure, through one or more of its various aspects, embodiments and/or specific features or sub-components, is thus intended to bring out one or more of the advantages as specifically noted below. The present disclosure provides a description of a method for optimizing the methodology of testing the functionality and compliance of semiconductor device test interface hardware, located between the Automatic Test Equipment (ATE) and the semiconductor device under test (DUT).

Integrated Circuit (IC) testing is a complex enterprise. At all points during the process, the hardware and software used in the testing protocol must produce accurate and repeatable results. This means that the automated test equipment or ATE must be calibrated and compliant, the software must be validated, and the interface hardware must also be calibrated and compliant.

As the complexity of integrated circuits has grown, so has the complexity of the DIH. Testing of the DIH can be complex in itself. In most cases, active circuits are tested using loopback methods. However, it is not practical in terms of board layout and complexity to provide loopback paths for all circuits and components on a DIH. In order to avoid electrical stubs that degrade signal integrity, loopback paths must be isolated during device testing by using an isolation switch. It is simply not practical to provide an isolation switch for every circuit path on the DIH. Consequently, the most common method to detect degraded DIH performance, or even catastrophic failure, is to monitor the device test yield. If the test yield drops below an expected level, then the DIH along with other parts of the system must be excluded as the source of the degraded yield. This common method is worrisome because it does not screen for a different problem, which is the test escape or false pass result. This all adds up to a need in semiconductor testing for efficient and accurate methods for DIH testing.

Ideally, DIH testing is short in duration and can be performed while the DIH is connected to the tester without contact with the device under test. This methodology will avoid having to remove the semiconductor board from production for semiconductor board testing, as well as eliminating any chance of damage to the semiconductor device during semiconductor board testing.

FIG. 1 shows a selected listing of test resources that perform DIH testing, and the testing functions that each test resource performs. The test resources include (1) Digital Pin Electronics (DPE) Testing, (2) Per Pin Parametric Measurement Unit (PPMU) Testing, (3) Source Measurement Unit (SMU) Testing, (4) Arbitrary Waveform Generator (AWG) Testing, (5) Digitizer (DIG) Testing, and (6) Device Under Testing Power Supply (DPS) Testing.

Since AWG and DIG resources are very expensive and not very common, this disclosure focuses on the following four listed tester resources shown in FIG. 1, which include (1) Digital Pin Electronics (DPE) Testing, (2) Per Pin Parametric Measurement Unit (PPMU) Testing, (3) Source Measurement Unit (SMU) Testing, and (6) Device Under Testing Power Supply (DPS) Testing. Additionally, since PPMU Testing is included with every DPE Testing channel, DPE Testing covers both DPE Testing and PPMU Testing. Also, DPS Testing resources are similar, but more limited than SMU Testing resources, except that they can source (not force) more current and typically higher voltages. Furthermore, DPS Testing resources are also not capable of sourcing current, only voltage.

A digital pin electronics (PE) resource shown in a semiconductor tester for testing a Device Under Test (DUT) 104 has four basic components: (1) voltage driver, (2) a current load, (3) a pair of voltage comparators, and (4) a Multiplexed Per Pin Parametric Measuring Unit (PPMU) (not shown), which is switched into the Digital Pin Electronics (DPE) output as needed. The voltage driver is used to send a digital voltage signal to the DUT. The current load provides a 50 Ohm load to a voltage source with a programmable current clamp. By having a pair of voltage comparators, the sensed signal can be determined to be above both, below both, or between the pair depending on how they are programmed.

Digital Pin Electronics are used for functional testing, which includes pass/fail testing, which is repeatable and deterministic. A Digital Pin Electronics resource does not make floating point measurements of voltage, unless controlled in a very specialized way. Additionally, a Digital Pin Electronics resource does not drive a periodic analog waveform. Instead, a Digital Pin Electronics resource drives a digital square wave with two states. Test functions related to DPE include a Functional Reflectometry Test (FRT), an Impedance Response Profile (IRP), Fast Fourier Transform (FFT), and Leakage.

A Source-Measurement Unit (SMU) is an electronic instrument that is capable of both sourcing and measuring at the same time. An SMU force voltage and simultaneously measure current, or force current and simultaneously measure voltage. Test functions related to SMU include Force Voltage, Measure Current (FVMI), Force Current, Measure Voltage (FIMV), and Leakage.

An SMU is used for parametric testing. Such testing includes floating point measurements of voltage and current. Parametric testing is made relative to a trigger, such as for a measurement made at a specific relative point in time. Parametric testing also makes measurements that can be single point pass/fail relative to an upper and lower limit, or sampled repeatedly over time for statistical evaluation. SMUs are also used for test applications requiring high accuracy and resolution, while sourcing either positive or negative values of voltage or current.

Figure 4:
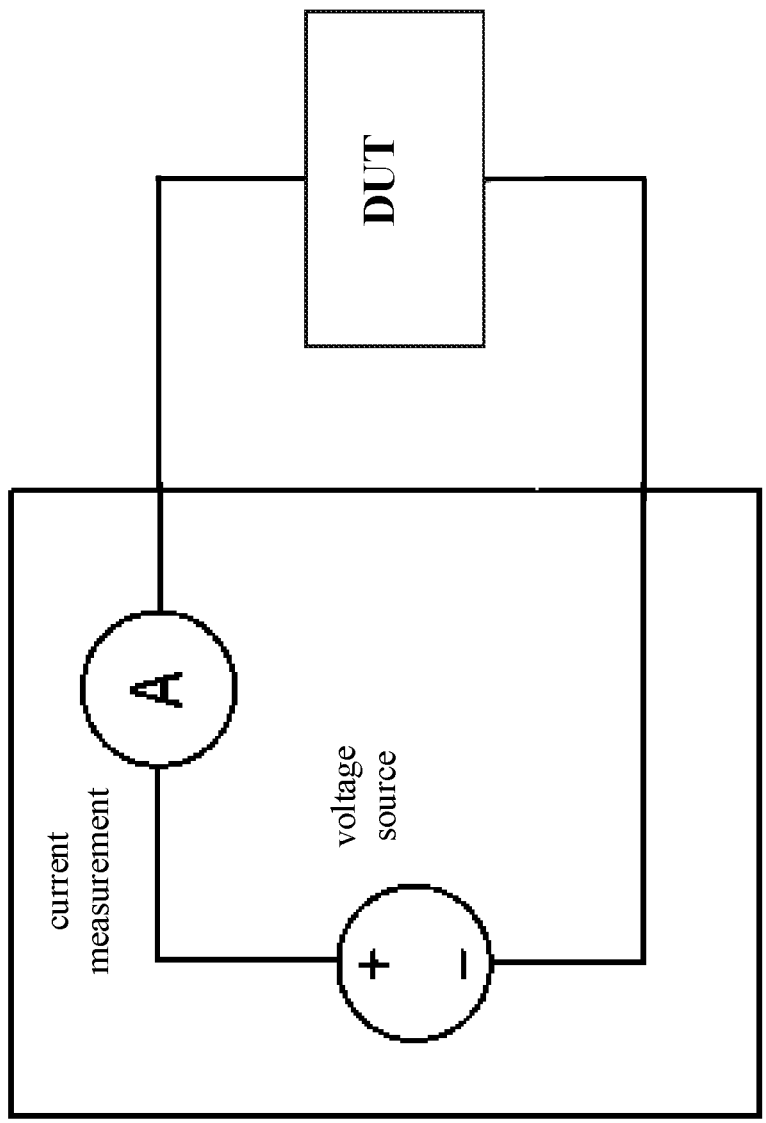
FIG. 4 shows a Device Under Test (DUT) Power Supply (DPS)

The Device Under Test (DUT) Power Supply (DPS) resource unit is an electronic instrument that is capable of sourcing voltage and measuring current, which is illustrated in FIG. 4. Some DPS resources have a current clamp that limits the amount of current that can be sourced (out of the supply) or sunk (into the supply). Other DPS resources can only force a positive voltage, while another DPS resource can source either positive or negative voltages.

A DPS resource is used for supplying power to a semiconductor device under test. DPS units are typically the highest power resource in the test system. Capacitive charge reservoirs can be included in the connection between a DPS and the DUT to supply transient current demand that the supply itself cannot provide alone.

Testing Methodologies for optimizing the testing the functionality and compliance of semiconductor device test interface hardware, located between the Automatic Test Equipment (ATE) and the semiconductor device under test (DUT) include the following testing protocols.

I. Using Alarm Conditions for Testing the State of Switches and Decoders

Semiconductor test systems often contain a variety of high performance test and measurement instruments. These instruments typically have sensing functionality that can detect when the instrument is operating beyond the limits of safe operating conditions. When events like this occur, the instrument will typically provide a software alarm that can interrupt execution of the control program, shut down the instrument, and provide diagnostic information. This feature of operation has these purposes: (1) Protect the device under test, (2) Protect the tester resource, (3) Protect the DIH, (4) Protect the human operator (where applicable), (5) Limit false failures or test escapes, and (6) Provide diagnostic information for corrective action.

Conventional testing methodology is to never intentionally allow or cause a tester resource alarm while testing semiconductors with a testing system as it would defy common sense and safe practices.

However, the novel testing methodology disclosed herein contradicts the conventional methodology by conducting a novel testing protocol in which the testing system directly tests the Device Interface Hardware (DIH) while the testing system is not connected to a semiconductor device under test (DUT).

For example, when verifying the tester resource, alarms must be intentionally forced in order to test the sensing and alarm functionality. Verification testing is done prior to the resource being placed into production and occasionally during periodic maintenance testing. So, of course, intentionally forcing an alarm condition is required during verification testing.

An important difference between unintended alarms and intentional alarms during verification testing is that verification testing involves manufacturer developed software and test hardware that help insure that no damage is caused to the tester resource or diagnostic hardware during verification test. However, this is in stark contrast to unintentional alarms caused by customer developed code and DIH when almost anything can happen.

Additionally, tester resources typically have internal limiters for voltage and current levels that can prevent instrument damage, leaving the only source of potential damage to external sources beyond the instrument's control, in other words, customer software and hardware driven conditions. Thus, this leaves the highest probability for damage is to DIH.

The DIH is customer defined. The software that uses DIH is customer defined. Protecting the DIH from damage is entirely up to the customer. Since the point of the invention is to use the tester to test the DIH for functionality and compliance, the question is now "does the same convention of never intentionally forcing an alarm still apply to testing the DIH?" Conventional wisdom says "yes, the same convention applies." That is, never intentionally cause an alarm condition, because you intentionally force the tester resource to operate outside of its safe operating limits, which has a distinct probability of causing damage to the DIH.

The invention defies the conventional wisdom and follows an opposite path. An intentional alarm condition can, most definitely, be used as a diagnostic method for functionality testing of the DIH. The execution of the diagnostic test without damage to the ATE or DIH requires that the customer's test code leverages the resource voltage and current limits to protect the DIH and ATE resource hardware during test. The innovation is that the presence or the absence of an alarm is equivalent to a pass or fail outcome in functional testing.

During instrument verification, the entity under test is the alarm itself, and forcing an alarm condition to test detection is the only way to effectively verify functionality.

When testing a device under test external to the instrument, the alarm condition is something to be avoided as the alarm condition indicates an "error" state or potentially damaging conditions outside the normal range of operation. If the alarm condition was used to indicate an error condition with the device under test, the alarm condition internal to the instrument correlates to an error condition of the device under test.

What is contemplated by the disclosed methodology is something different and novel. In the disclosed methodology, the alarm condition of the instrument does not correlate to an error condition of the thing under test, only one of two possible states, both of which are functionally valid. For example, if the device under test has two valid states (A and B), then the test is designed to produce the following outcome: State A: no alarm, State B: alarm. In this case, the instrument is being used in a manner completely outside its intended application.

When using an alarm condition to test functional states of an external object, such as a device under test, care must be taken to control voltage and current levels that might spike during the alarm state and cause damage either to the instrument itself or the external object under test.

Figure 5:
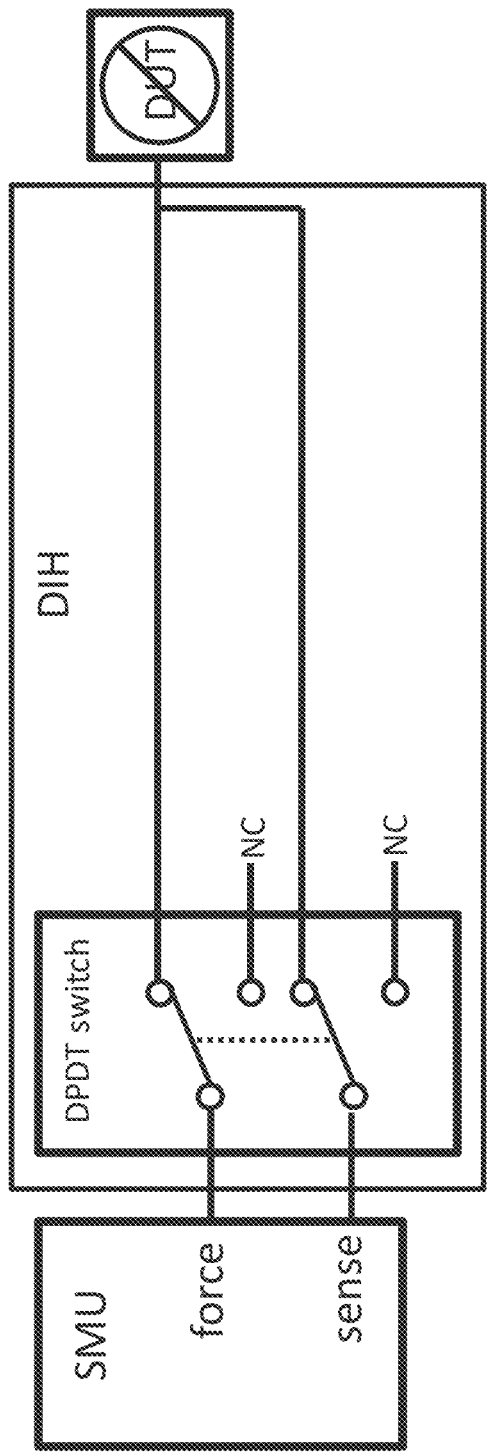
FIG. 5 illustrates Device Under Test (DUT) Interface Hardware (DIH)

As illustrated in the exemplary embodiment disclosed in FIG. 5, when using the tester to perform functional testing of the DIH, there is no semiconductor device present (no DUT connected). In this scenario, there is no simple way to test the functionality of the switch, which is part of the DIH circuitry as there is no signal source from the DUT.

However, by using the alarm methodology, it is possible to test the switch with no DUT present. For the switch configuration shown FIG. 5, a voltage is applied using the SMU in a first state in which the force and sense lines are connected on the DIH. Then the DIH is checked for an alarm. No alarm should occur as the force and sense lines are connected on the DIH, which would indicate that the alarm is working properly. On the other hand, the initiation of an alarm would indicate that the alarm is not working properly (an error state).

Next, the switch is actuated to change a second state, in which the force and sense lines are not connected on the DIH. Once again, the DIH is checked for an alarm. The alarm should have occurred because the force and sense line connection has been broken, which indicates that the alarm is working properly (an error state).

Using Chatter to Augment Alarm Methods

Figure 6:
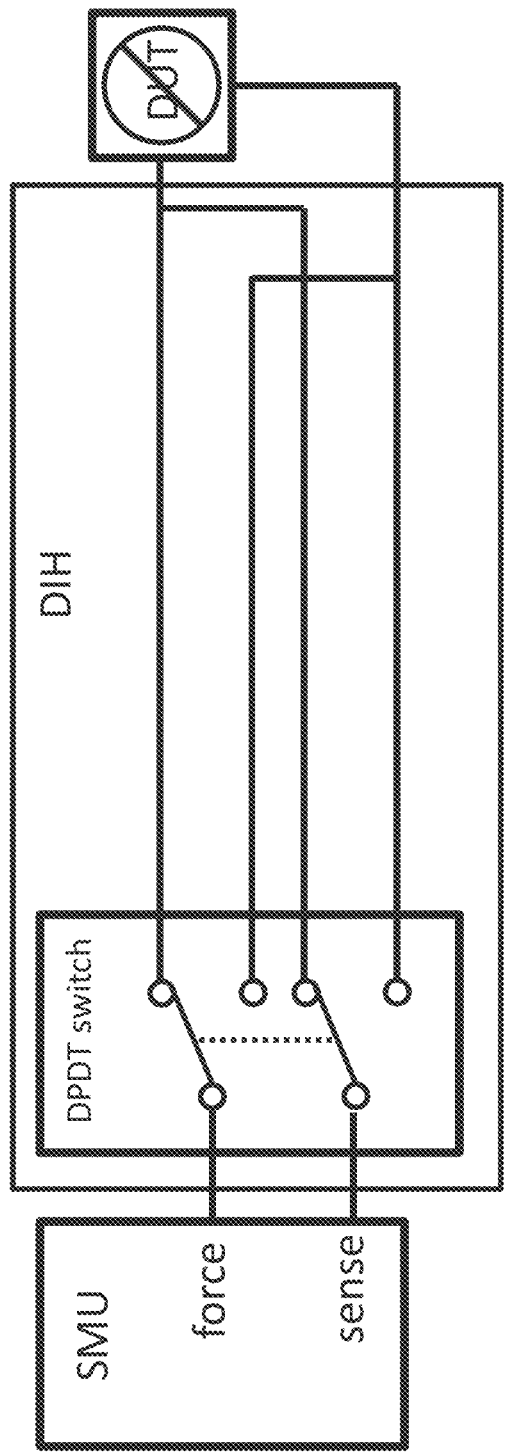
FIG. 6 shows a Double-Pole Switching in DIH.

When using the tester to perform functional testing of the DPDT switch, there is no semiconductor device present (no DUT connected). In this scenario, there is no simple way to test the functionality of the switches, which are part of the DIH circuitry, as there is no signal source from the DUT. To complicate this scenario, there is no way for the SMU to differentiate between the two states of the switch. This situation is because neither of the two states causes an alarm as both states result in the force and sense lines being connected on the DIH when the SMU is driving a voltage. This situation is illustrated in FIG. 6.

However, when the DPDT switch is an electromechanical switch, when changing states, the period of time during which neither switch is connected is often long enough to trigger an alarm when the sampling rate of the applied voltage is set correctly. More specifically, the sampling rate of the applied voltage on the feedback sense line must be set to be substantially faster than the disconnect time of the switch. Electromechanical switches have disconnect durations measured in the milliseconds, while SMU's sample in the 100 KS/s to 1 MS/s or every 1 to 10 us. This type of setting is sufficiently fast to detect a disconnection between the force and the sense lines and to activate an alarm.

In an alternative embodiment when the DPDT Switch is a solid state switch, such as a decoder switch, then when changing states in the solid state switch, the period of time during which neither the force switch nor the sense switch is connected is most likely too short in duration to trigger an alarm. Solid state switches, such as decoders, have disconnect durations measured in the 50 to 100 ns range. This would require an SMU sampling frequency in the 10 to 100 MHz range, which are typically not supported.

Thus, in order for an SMU alarm to detect the disconnected state, the switch must be suspended in the disconnected state in order to give the SMU a sufficient number of samples to detect the force and sense lines not being connected. To accomplish this scenario, the concept of "chatter" must be used.

Figure 7:
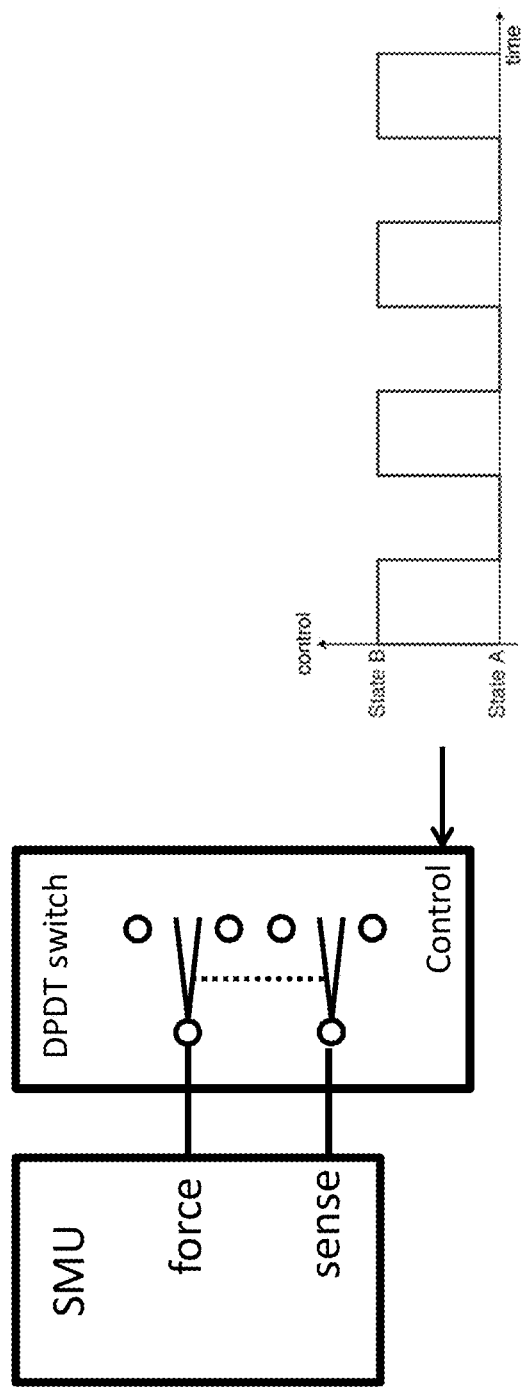
FIG. 7 illustrates the use of "Chattering" in Solid-State Switches.

"Chatter" is illustrated in FIG. 7. To execute "chatter", the DPDT switch is switched from a state A to a state B, and a wait period is executed until substantially 75% of the disconnect time has passed based on data sheet specifications. Next, the DPDT switch is chattered (switched back and forth) as described by the control square wave, such that the duration of each state A and state B is 50% of the disconnect time. This process will suspend the DPDT switch between states A and B at the approximate 25% and 75% positions as shown. Because of drift and uncertainty in the DPDT switch response, the timing may need to be modified or modulated as required by the specific application. The methodology continues to chatter the switch for a duration sufficiently long to cause an alarm condition on the SMU. Thus, when the control square wave shown in FIG. 7 is timely correctly and is sufficiently fast, the DPDT switch is suspended in a disconnected state by "chattering" back and forth between the two connected states A and B.

Measuring Coupling Capacitance with an SMU

Figure 8:
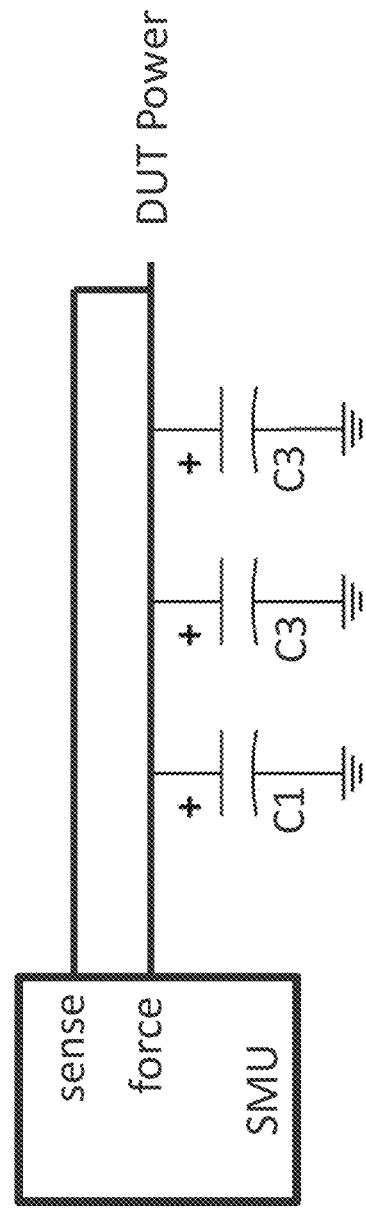
FIG. 8 shows Circuitry for Measuring Coupling Capacitance With a Source Measurement Unit (SMU)

SMU resources cannot make direct capacitance measurements. However, SMU resources can make measurements that contribute to the calculation of capacitance. For instance, in the exemplary embodiment illustrated in FIG. 8, the capacitance measurement includes the total parallel capacitance seen by the SMU. In the case of the circuit shown in FIG. 8, that is the sum of capacitors C1, C2, and C3.

In this methodology, in the first step, the SMU is programmed to output 0V (or Low Z mode) and discharge the decoupling capacitance. In the second step, the DPS voltage is turned off. In the third step, the SMU is placed into a voltage measurement mode (Hi Z) and a discharged state of 0V is confirmed. In a fourth step, the SMU is programmed to force current and measure voltage mode. In this step, a small charge current is used based on simulation. In the fifth step, the force current function is triggered at time zero. In the sixth step, a period, dT, is waited, as determined by circuit simulation to allow the decoupling capacitance to charge up from a fixed amount of current being forced, I. In the seventh step, the unit is placed into voltage measurement mode (Hi Z). In the eighth step, any delay time is added to dt. In the ninth step, the voltage, dv, is measured before the capacitance is fully charged. In the tenth step, the capacitance C is determined as C=I dv/dt. Since timing is critical in this methodology, the use of trigger methods should be used, if available.

Measuring Decoupling Capacitance with a DPS

Most DPS resources (DUT Power Supply) only source voltage and not current. For this reason, it is always better to use an SMU that can source both and measure both. When the only resource available is a DPS resource, measuring capacitance requires creativity.

Most DPS resources include a current limiter (clamp). The purpose of the limiter is to protect the resource from damage in the event of a short at the load. This would cause the current to exceed the maximum recommended level and damage the unit. It is never recommended to set the current clamp below the level required to properly power a device under test. Doing so places the output voltage at an unknown level that is lower than the programmed level. The DPS cannot be reliably used to test a DUT while in this state. It is a novel concept to intentionally place the DPS resource in this unsupported state in order to make decoupling capacitance measurements.

The methodology includes a plurality of steps as follows.

The first step is, with the current clamp set to the test application level, to program the DPS to output 0V (or Low Z mode) and discharge the decoupling capacitance. The second step is to turn off the DPS voltage. The third step is to place the unit into voltage measurement mode (Hi Z) and confirm a discharged state of 0V. The fourth step is to return the unit to force voltage mode. The fifth step is to set the current clamp to the minimum level, and program the DPS to output to a level between 1 and 3 volts (as determined by circuit simulation). The sixth step is to turn on the output at time zero. The seventh step is to wait a period of time, dt, as determined by circuit simulation to allow the decoupling capacitance to charge up from a fixed amount of current based on the clamp level, I. The eighth step is to place the unit into voltage measurement mode (Hi Z). The ninth step is to add any delay time to dt. The tenth step is to measure the voltage, dv before the capacitance is fully charged. The eleventh step is to determine the capacitance as C=I dv/dt. Since timing is critical in this methodology, the use of trigger methods should be used, if available.

Figure 9:
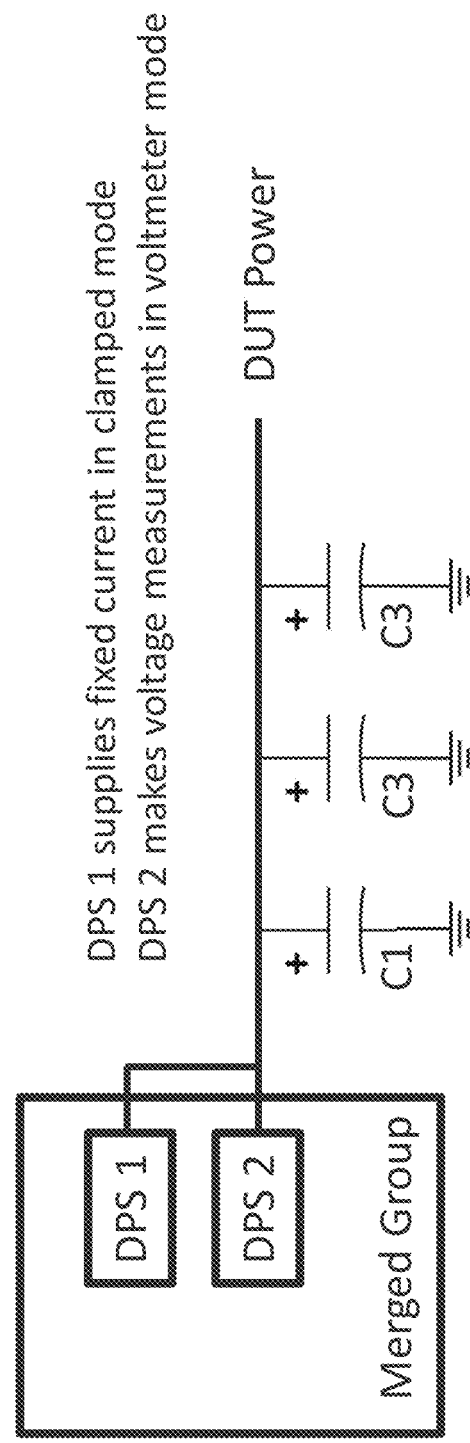
FIG. 9 shows Circuitry for Measuring Decoupling Capacitance with a Device Under Test (DUT) Power Supply (DPS) Having Dual DPS Power Supplies.

As a modification to this methodology, when two or more DPS resources are merged on a single DUT power supply domain as illustrated in FIG. 9, this method can be modified as follows. In this modification, the merged supplies are controlled independently. For instance, a first supply DPS 1 supplies fixed current in a clamped mode, and a second supply DPS 2 makes voltage measurements in a voltmeter mode. This method results in less timing uncertainty and improved calculation accuracy. Multiple measurements can be made and linear regression can be used to determine dv/dt.

Testing Merged Power Supplies Individually

There are times when power supplies are merged or ganged together in parallel in order to increase the level of current or power to a device under test. This configuration is used when a single supply cannot meet the power and current requirements. During a manufacturing test, various events may compromise the connectivity of one or more of the supplies in the merged group. Examples of errors include: (1) Pogo pins in the interconnect hardware that are stuck in the compressed position, (2) Failing individual power supply hardware in the tester, (3) DIH hardware schematic, layout and/or fabrication errors that have not been detected, and (4) software errors. Although this problem may not result in a 100% failure rate during a production test, it will likely results in reduced yield that is a much more difficult problem to debug.

Thus, contrary to conventional wisdom, it is a novel idea to confirm connectivity of each individual supply in a merged group.

In this methodology, all power supplies in a merged group of power supplies are turned off as a first step. In the second step, only the first power supply is enabled. In the third step, the capacitance is measured using the DPS method. Then, each step is repeated for each individual supply in the power supply group. Any individual power supply that is not connected, or not functional, will fail to make the capacitance measurement as made by the other power supply or other power supplies. This test can be combined with the DPS capacitance method to make both decoupling capacitance measurements and check for individual supply connectivity.

Propagation Delay

When the DIH is designed, it is common to receive (upon request) a report of transmission line lengths, particularly for transmission lines that are specified to be of equal length or no longer than some specified length. After fabrication and before DIH goes into production, it is often a requirement to perform a TDR calibration on the DIH in order to perform timing deskew. However, neither of these data sets tells the consumers of the DIH (test and product engineers) anything about the type and quality of the dielectric.

Thus, it is a novel concept to take these two data sets and calculate propagation delay, which is a calculation of the velocity of an electrical signal as it transits the transmission line. High speed or low loss dielectrics, such as Rogers, should have velocities that are measurably faster than standard PCB dielectrics such as FR4. By using the data from the trace length report (d, distance) and the TDR data (t, time), the velocity of the signals can be determined from the simple equation v=d/t. These calculations can be used to verify the dielectric type as well as the dielectric quality. This data can be analyzed across test sites as well as PCB layers. The calculations can also be used to baseline and then test for degradation (drift) in the quality of the dielectric over time.

Analog Test Bus

Figure 10:
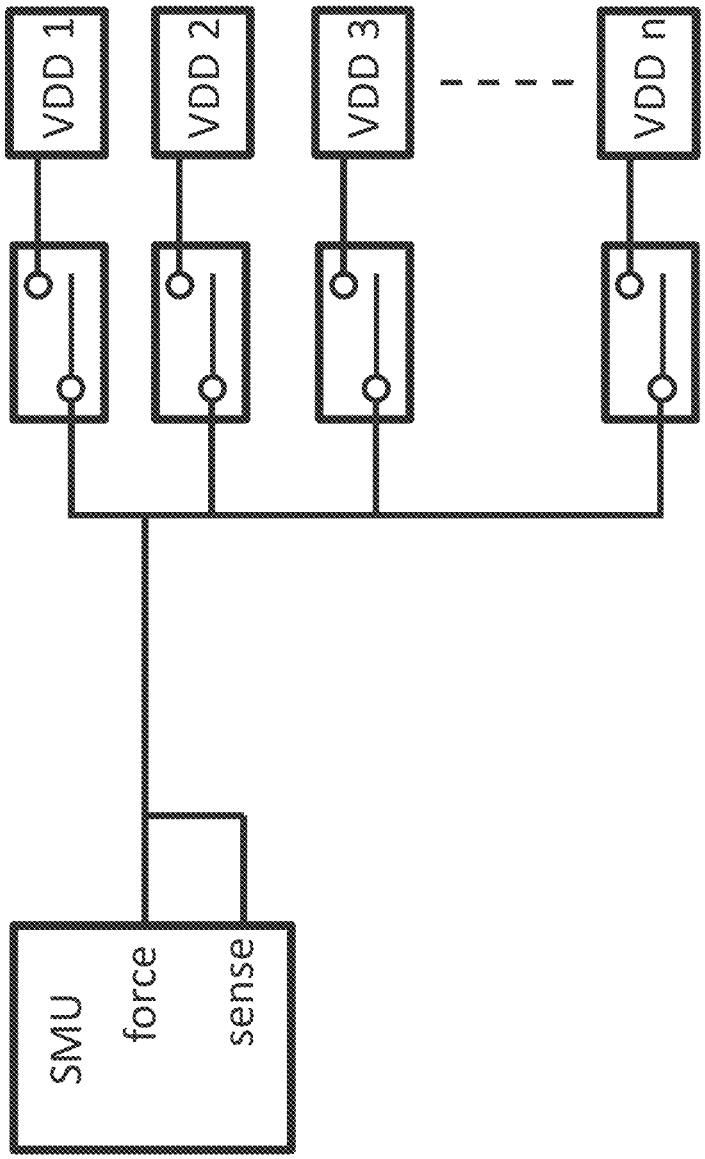
FIG. 10 shows a Configuration of an Analog Test Bus.

When the DPS power supply (previously described) is not sufficient to support the method, an SMU can be bussed across all distinct DUT power supply groups and test sites, as shown in FIG. 10. As the bus is DC, the presence of stubs and SSR on capacitance has no significant effect on the test application. Thus, it is a novel strategy to use an analog bus to test power supply decoupling capacitance.

Digital Test Bus for Analog Circuits

Figure 11:
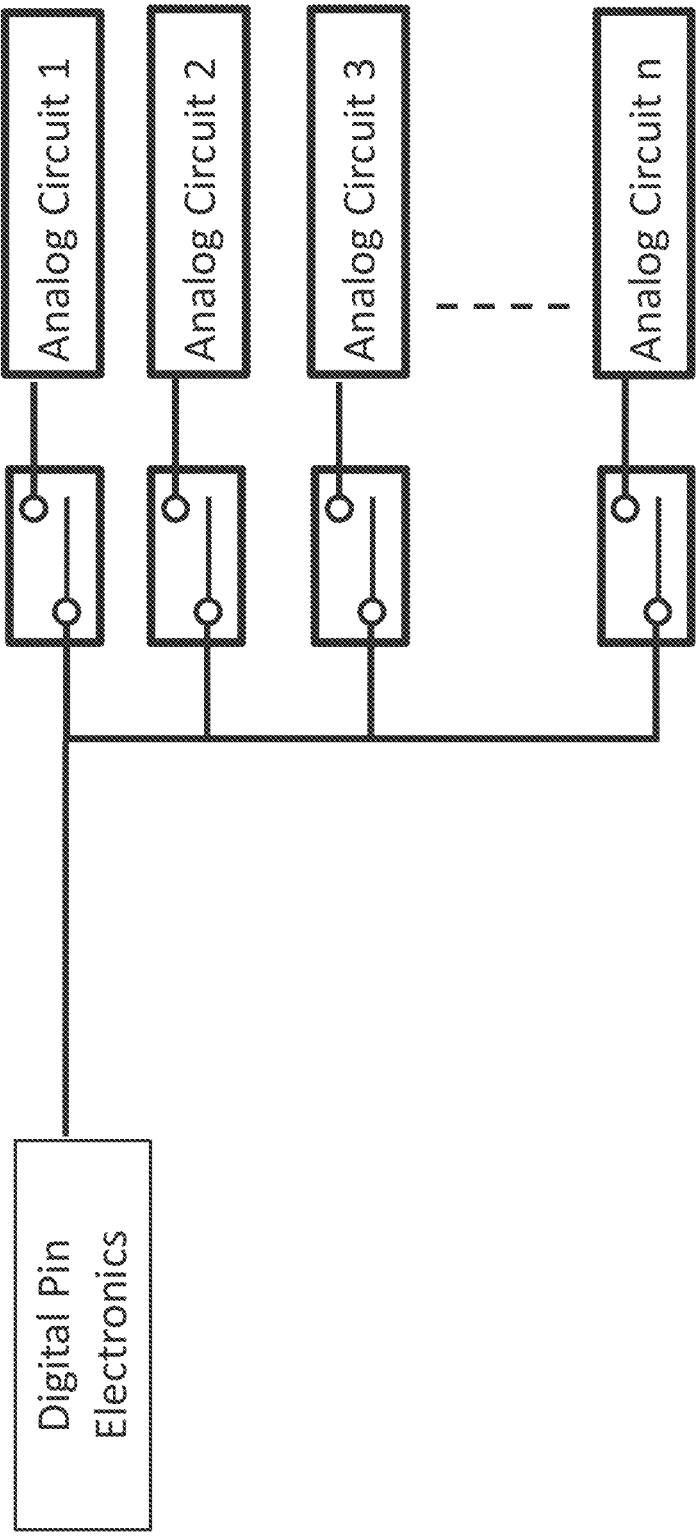
FIG. 11 shows a Configuration of a Digital Test Bus for Analog Circuits.

As illustrated in FIG. 11, it is a novel concept to connect DPE (digital Pin Electronics) to an analog circuit for the purpose of testing. It is a novel concept because the IRP (Impedance Response Profile) method is novel for testing analog circuits.

A listing of various acronyms used in this disclosure is provided below.
- DUT—device under test
- DIH—DUT interface hardware
- PCB—printed circuit board
- ATE—automated test equipment
- IC—integrated circuit
- DPE—digital pin electronics
- PPMU—per pin parametric measuring unit
- SMU—source measurement unit
- AWG—arbitrary waveform generator
- DIG—digitizer
- DPS—DUT power supply
- FRT—functional reflectometry test
- IRP—impedance response profile
- FFT—fast Fourier transform
- FVMI—force voltage, measure current
- FIMV—force current, measure voltage
- DPS—DUT power supply
- TDR—time domain reflectometry
- SSR—solid state relay
- Low Z—low impedance
- High Z—high impedance
- DPDT—double pole double throw (relay)

Figure 12:
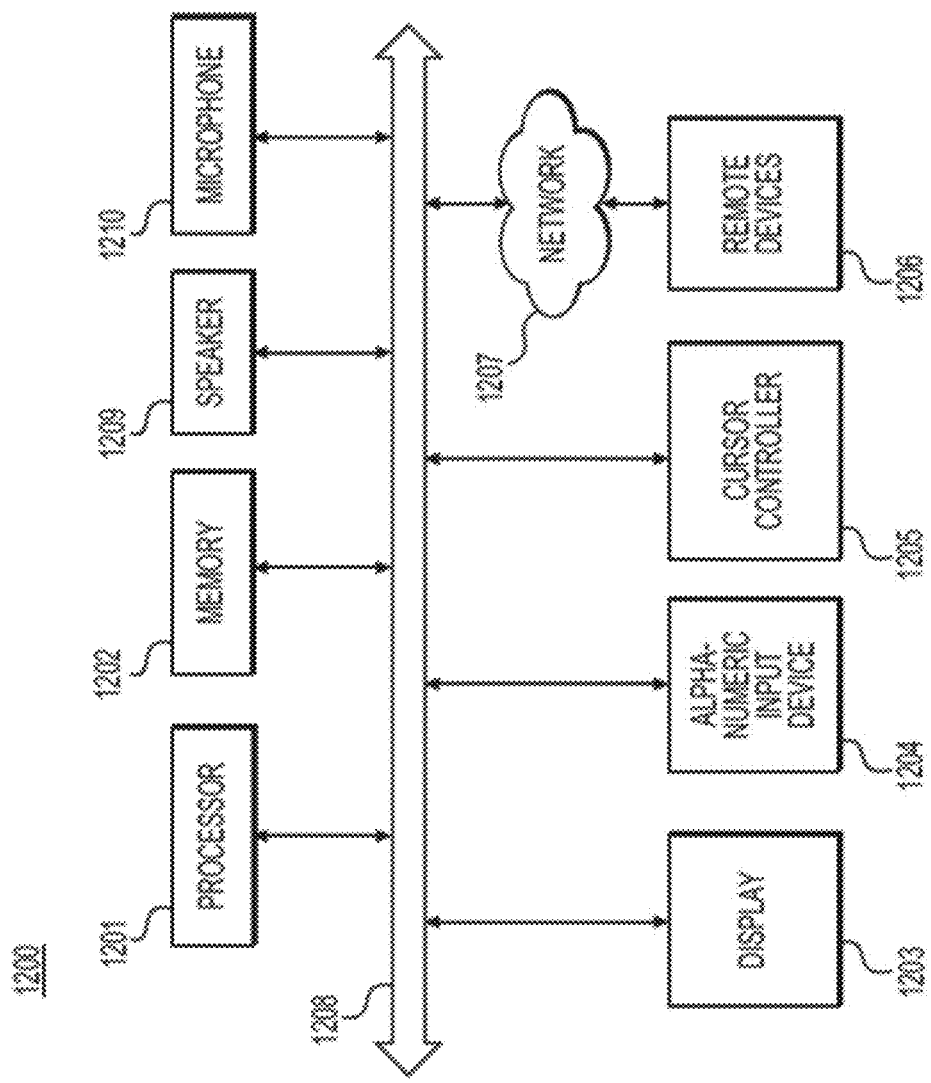
FIG. 12 illustrates an example of a computer that may be used in the DIH testing process described herein.

FIG. 12 illustrates an exemplary embodiment of a computer 1200 that may be used in the semiconductor testing process that utilizes automated semiconductor test equipment and robotic handlers. The computer 1200 includes one or more sets of computer programming instructions that are stored in memory 1202 and that can be executed by processor 1201 in computer 1200 to perform the process described above. Computer 1200, which when properly programmed with specific testing software, becomes a special purpose computer that is configured for a specialized set of testing operations and functions.

The computer utilized in semiconductor test system may be present in one of many physical configurations, including being configured as a server or as a client terminal. The computer may also be associated with various devices, such as a desk-top computer, a laptop computer, a personal digital assistant, a mobile device, an electronic tablet, a smart phone, etc.

As illustrated in FIG. 12, the computer 1200 includes a processor 1201 and memory 1202, which is representative of one or more various memories that may be used by the computer 1200. These memories may include one or more random access memories, read only memories, and programmable read only memories, etc. Computer 1200 also includes at least one display 1203, which may be provided in any form, including a cathode ray tube, a LED display, an LCD display, and a plasma display, etc. The display may include provisions for data entry, such as by a touch-sensitive screen. Additional output devices may include an audio output device, such as a speaker 1209.

Computer 1200 further includes one or more input devices. Input devices may include one or more of an alpha-numeric input device 1204, such as a keyboard; a cursor controller 1205, such as a mouse, touch-pad, or joy-stick; and a microphone 1210. Computer 1200 also enables processor 1201 to communicate with one or more remote devices 1206 over a network 1207 external to computer 1200. Communications internal to computer 1200 primarily use bus 1208.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor, or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet-switched network transmission represent examples of the state of the art. Such standards are periodically superseded by faster or more efficient equivalents having essentially the same functions. Accordingly, replacement standards and protocols having the same or similar functions are considered equivalents thereof. The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately-claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for determining a decoupling capacitance C of a device under test interface circuitry, the device under test interface circuitry located between automated testing equipment (ATE) and a device under test (DUT), comprising:
    disconnecting the DUT from the device under test interface circuitry;
    connecting a Device Under Testing Power Supply (DPS) resource as a DUT Power Supply to the device under test interface circuitry;
    setting a current clamp of the DPS resource to a test application level;
    turning off the DPS resource voltage and confirming a discharged state of zero volts;
    setting the DPS resource to a force voltage mode;
    setting the current clamp to a minimum current level and programming the DPS resource to output a predetermined low voltage level;
    turning on the output at time zero;
    waiting a period of time dt to allow the decoupling capacitance C to charge up from a fixed amount of current based on a current clamp level I;
    placing the DPS resource into a voltage measurement mode having high impedance;
    adding any delay time to the waiting of the period of time dt;
    measuring the voltage dv before the capacitance is fully charged; and
    determining the decoupling capacitance C.

2. The method according to claim 1, wherein the determining the decoupling capacitance C is determined by the equation $$C = I\, dv/dt.$$

3. The method according to claim 1, wherein the setting the current clamp to a minimum current level corresponds to a minimum current level of 1 to 3 volts.

4. The method according to claim 3, wherein the setting the current clamp to a minimum current level corresponds to a minimum current level determined by a circuit simulation.

5. The method according to claim 1, wherein the waiting of the period of time dt is determined by a circuit simulation.

6. The method according to claim 1, wherein the connecting a DPS resource as a DUT Power Supply to the device under test interface circuitry includes connecting two DPS resources as a merged DUT Power Supply.

7. The method according to claim 6,
wherein the two DPS resources include a first DPS resource that supplies fixed current in the clamped mode, and a second DPS resource that makes voltage measurements in a voltmeter mode.

8. The method according to claim 7,
wherein the first DPS resource and the second DPS resource are controlled independently from one another.

9. The method according to claim 8,
wherein the multiple measurements are conducted using the merged DUT Power Supply, and the decoupling capacitance is determined using linear regression.

\* \* \* \* \*